United States Patent
Yi et al.

(10) Patent No.: US 8,289,064 B2
(45) Date of Patent: Oct. 16, 2012

(54) DIFFERENTIAL OFFSET CALIBRATION CIRCUIT

(75) Inventors: Bin-Wei Yi, Taichung (TW); Hao-Chang Chang, Taipei (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 231 days.

(21) Appl. No.: 12/779,961

(22) Filed: May 14, 2010

(65) Prior Publication Data

US 2011/0241751 A1    Oct. 6, 2011

(30) Foreign Application Priority Data

Mar. 31, 2010  (TW) ............................. 99109863 A

(51) Int. Cl.
*H03L 5/00*    (2006.01)

(52) U.S. Cl. ...................................... 327/307; 330/254

(58) Field of Classification Search .................. 327/307, 327/530, 534–546, 551–559; 330/254, 288, 330/296
See application file for complete search history.

(56) References Cited

U.S. PATENT DOCUMENTS

| 5,631,603 | A | 5/1997 | Stubbe et al. |
| 6,807,118 | B2 | 10/2004 | Perner |
| 2006/0077003 | A1* | 4/2006 | Chiu et al. ................. 330/9 |
| 2008/0116902 | A1* | 5/2008 | Kim et al. ................. 324/601 |

* cited by examiner

*Primary Examiner* — Lincoln Donovan
*Assistant Examiner* — Diana J Cheng
(74) *Attorney, Agent, or Firm* — Jianq Chyun IP Office

(57) ABSTRACT

A differential offset circuit adapted for an adaptive filter of a receiver front end is provided. The differential offset circuit includes four controllable current sources which are respectively coupled to two differential output terminals of the adaptive filter. The current magnitudes of the controllable current sources are capable of being adjusted according to design requirements so that the differential offset of the adaptive filter is mitigated to avoid that the adaptive filter outputs a distorted signal to affect the accuracy of signal transmission.

6 Claims, 5 Drawing Sheets

DIFFERENTIAL OFFSET CALIBRATION CIRCUIT

CROSS-REFERENCE TO RELATED APPLICATION

This application claims the priority benefit of Taiwan application serial no. 99109863, filed on Mar. 31, 2010. The entirety of the above-mentioned patent application is hereby incorporated by reference herein and made a part of specification.

BACKGROUND OF THE INVENTION

1. Field of the Invention

The invention relates to a differential offset calibration circuit. More particularly, the invention relates to a differential offset calibration circuit adapted to mitigating differential offset of an adaptive filter.

2. Description of Related Art

Due to a fabrication process variation, a common gain of a differential amplifier is not zero, which may cause an output differential offset. In case of a relatively great voltage operation range, a tiny differential offset does not affect a normal signal output. As shown in FIG. 1, FIG. 1 is a signal waveform diagram of a differential offset according to a conventional technique. When a voltage operation range FR1 is relatively great, although an output signal 110 has a differential offset OFS, since a signal amplitude thereof does not exceed the voltage operation range FR1, an integral signal waveform can still be output.

However, with a continuous development of the fabrication process, a chip size becomes smaller, and an operation voltage thereof becomes lower. For example, the operation voltage is decreased from 2.5V to 1.8V. Since an applicable voltage operation range is gradually decreased, effects that can be originally ignored under the high voltage source become serious, which may affect a signal correctness. As shown in FIG. 2, FIG. 2 is a signal waveform diagram of a differential offset according to a conventional technique. When a voltage operation range FR2 becomes smaller, the differential offset OFS can lead to a waveform distortion of the output signal 110. In this case, even if a post-end has a good circuit characteristic, the integrity of the signal cannot be restored. Therefore, as devices are miniaturized, an effect that the differential offset influences the correctness of the signal transmission becomes obvious.

To resolve such problem, the conventional technique provides several technical resolutions. For example, an offset calibration operation is added to a normal circuit operation, though such method is not adapted to all of receiver circuits. Alternatively, during a sampling phase of an analog-to-digital circuit, an inverted differential offset is provided to counteract the differential offset in the circuit, though such method requires an additional reference voltage generator, so that a circuit occupation area and power consumption are greatly increased. Moreover, a high pass filter can be disposed on a signal transmission path to re-provide a common mode voltage, so as to block the influence of the differential offset. However, such method also requires an additional reference voltage generator and a large capacitor.

SUMMARY OF THE INVENTION

The invention is directed to a differential offset calibration circuit, in which a plurality of controllable current sources is directly disposed on an output stage circuit of an adaptive filter for adjusting a differential offset. Since the controllable current sources are disposed on the output stage circuit of the adaptive filter, a differential offset adjusting amount of the differential offset calibration circuit is not influenced by a gain variation of the adaptive filter, and meanwhile increasing of excessive layout area and design cost is avoided.

The invention provides a differential offset calibration circuit adapted for an adaptive filter. The adaptive filter has an input stage and an output stage, wherein the output stage is coupled to the input stage and has a first output terminal and a second output terminal. The differential offset calibration circuit includes four controllable current sources, wherein the first controllable current source is coupled between a voltage source and the first output terminal, the second controllable current source is coupled between the first output terminal and a ground terminal, the third controllable current source is coupled between the voltage source and the second output terminal, and the fourth controllable current source is coupled between the second output terminal and the ground terminal.

In an exemplary embodiment of the invention, when the first controllable current source and the fourth controllable current source are enabled, the second controllable current source and the third controllable current source are disabled. When the second controllable current source and the third controllable current source are enabled, the first controllable current source and the fourth controllable current source are disabled.

In an exemplary embodiment of the invention, the input stage includes a first P-type transistor, a second P-type transistor, a first N-type transistor, a second N-type transistor and a frequency compensation unit. A source of the first P-type transistor is coupled to a voltage source, a drain of the first P-type transistor is coupled to a gate of the first P-type transistor and a drain of the first N-type transistor. A source of the first N-type transistor is coupled to one end of a fifth current source, and another end of the fifth current source is coupled to a ground terminal. A source of the second P-type transistor is coupled to the voltage source, and a drain of the second P-type transistor is coupled to a gate of the second P-type transistor and a drain of the second N-type transistor. A source of the second N-type transistor is coupled to one end of a sixth current source, and another end of the sixth current source is coupled to the ground terminal. The frequency compensation unit is coupled between the source of the first N-type transistor and the source of the second N-type transistor, wherein the gates of the first N-type transistor and the second N-type transistor are used for receiving a differential input signal.

In an exemplary embodiment of the invention, the output stage includes a first output unit and a second output unit. The first output unit has the first output terminal, and the first output unit includes a first mapping unit and a first gain control unit. The first mapping unit includes a plurality of third P-type transistors, the third P-type transistors are connected in parallel between the voltage source and the first output terminal (for example, sources of the third P-type transistors are coupled to the voltage source, and drains thereof are coupled to the first output terminal), and a gate of each of the third P-type transistors is selectively coupled to the gate of the first P-type transistor or the voltage source. The first gain control unit includes a plurality of third N-type transistors, the third N-type transistors are connected in parallel between the first output terminal and the ground terminal (for example, drains of the third N-type transistors are coupled to the first output terminal, and sources thereof are coupled to the ground terminal), and a gates of each of the third N-type transistors is selected coupled to a bias voltage or the ground terminal. The first output unit controls conductive states of the third P-type transistors and the N-type transistors by controlling terminals coupled to the gates thereof. In an exemplary embodiment of the invention, during a normal circuit operation, conducting numbers of the third P-type transistors and the N-type transistors are identical.

The second output unit has the second output terminal, and the second output unit includes a second mapping unit and a second gain control unit. The second mapping unit includes a plurality of fourth P-type transistors, the fourth P-type transistors are connected in parallel between the voltage source and the second output terminal, and a gate of each of the fourth P-type transistors is selectively coupled to the gate of the second P-type transistor or the voltage source. The second gain control unit includes a plurality of fourth N-type transistors, the fourth N-type transistors are connected in parallel between the second output terminal and the ground terminal, and a gate of each of the fourth N-type transistors is selectively coupled to the bias voltage or the ground terminal. Similarly, in an exemplary embodiment of the invention, during a normal circuit operation, conducting numbers of the fourth P-type transistors and the N-type transistors are identical.

Switching devices are used to respectively switch the gates of the third P-type transistors, the third N-type transistors, the fourth P-type transistors and the fourth N-type transistors for determining conductive states thereof. The switching devices in the first output unit and the second output unit can be controlled by a same gain signal, so that numbers of conducted transistors in the first and the second mapping units and the first and the second gain control units are the same, so as to avoid generating asymmetric current voltage level and gain value at the output terminal.

In an exemplary embodiment of the invention, the first controllable current source to the fourth controllable current source respectively include a plurality of sub current sources connected in parallel, and conducted current amounts of the sub current sources of each of the controllable current sources are sequentially increased by a multiple of power of 2, wherein each of the controllable current sources adjusts the conducted current amount according to a setting value.

According to the above descriptions, the controllable current sources are used for adjusting the differential offset of the adaptive filter. Since the controllable current sources are disposed at the output stage of the adaptive filter, the invention is adapted to a variable gain circuit structure, and a wide-range calibration is achieved by controlling magnitudes of the current sources.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EXEMPLARY EMBODIMENTS

Figure 1:
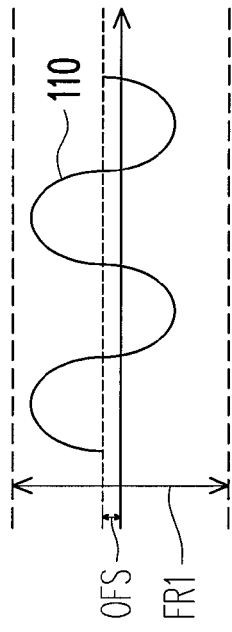
FIG. 1 is a signal waveform diagram of a differential offset according to a conventional technique.
Figure 1:
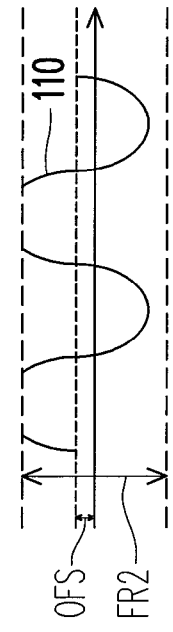
Figure 2:
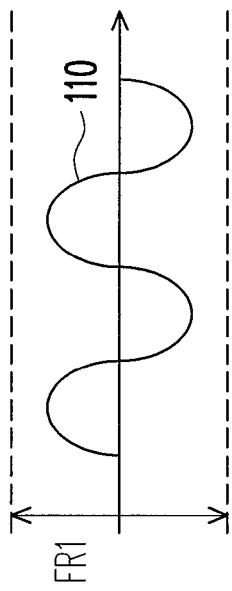
FIG. 2 is a signal waveform diagram of a differential offset according to a conventional technique.
Figure 2:
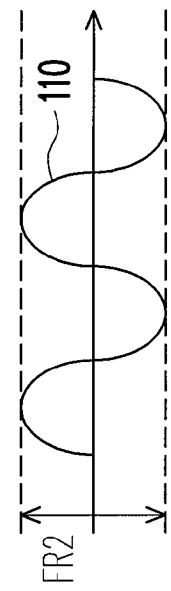
Figure 3:
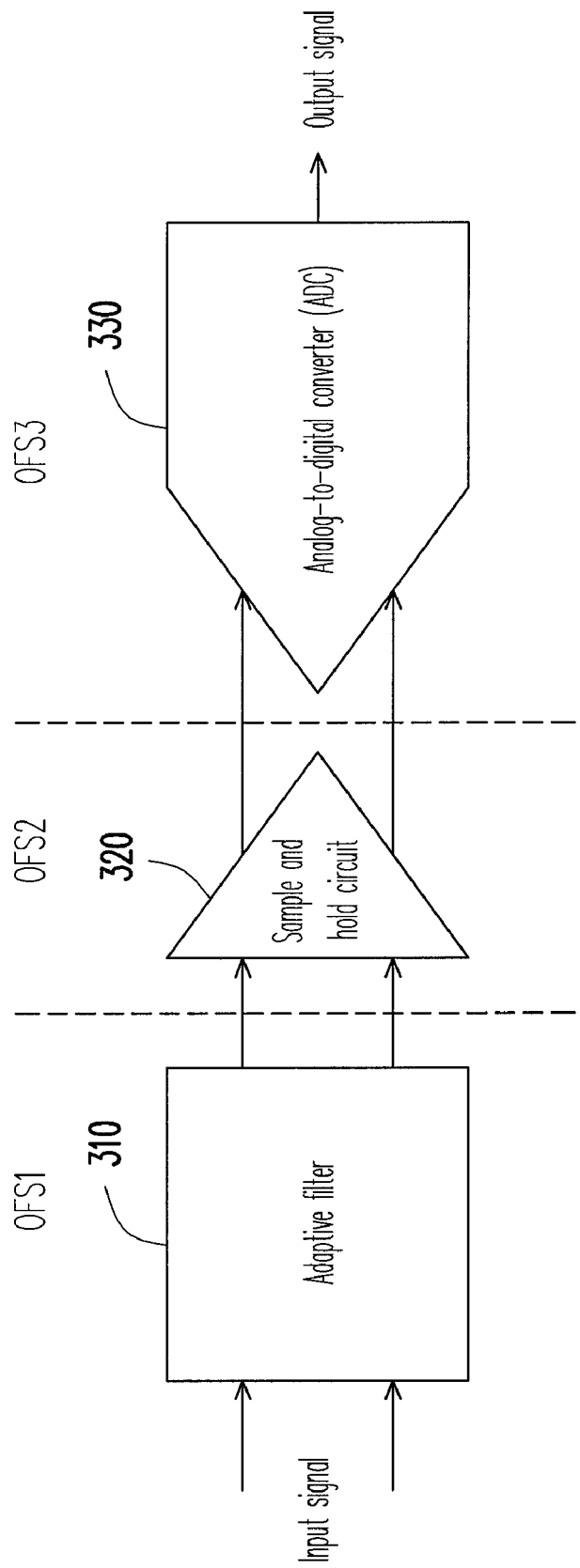
FIG. 3 is a schematic diagram illustrating a front-end circuit of a receiver according to an exemplary embodiment of the invention.

Referring to FIG. 3, FIG. 3 is a schematic diagram illustrating a front-end circuit of a receiver according to an exemplary embodiment of the invention. The front-end circuit of the receiver generally includes an adaptive filter 310, a sample and hold circuit 320, and an analog-to-digital converter (ADC) 330. The sample and hold circuit 320 is coupled between the adaptive filter 310 and the ADC 330. The adaptive filter 310 is used to restore a high frequency content of a signal. The sample and hold circuit 320 and the ADC 330 are used to convert an analog signal into a digital signal, and provide the digital signal to a digital circuit for processing. The adaptive filter 310 consists of a differential amplifier circuit and a frequency compensation circuit formed by resistors and capacitors.

Ideally, the adaptive filter 310, the sample and hold circuit 320 and the ADC 330 can all maintain integrity of an input signal without causing a processing error of the digital circuit. But in fact, different characteristics of bandwidths, linearity and noise performances of the three circuits can all influence the integrity of the input signal.

Figure 4:
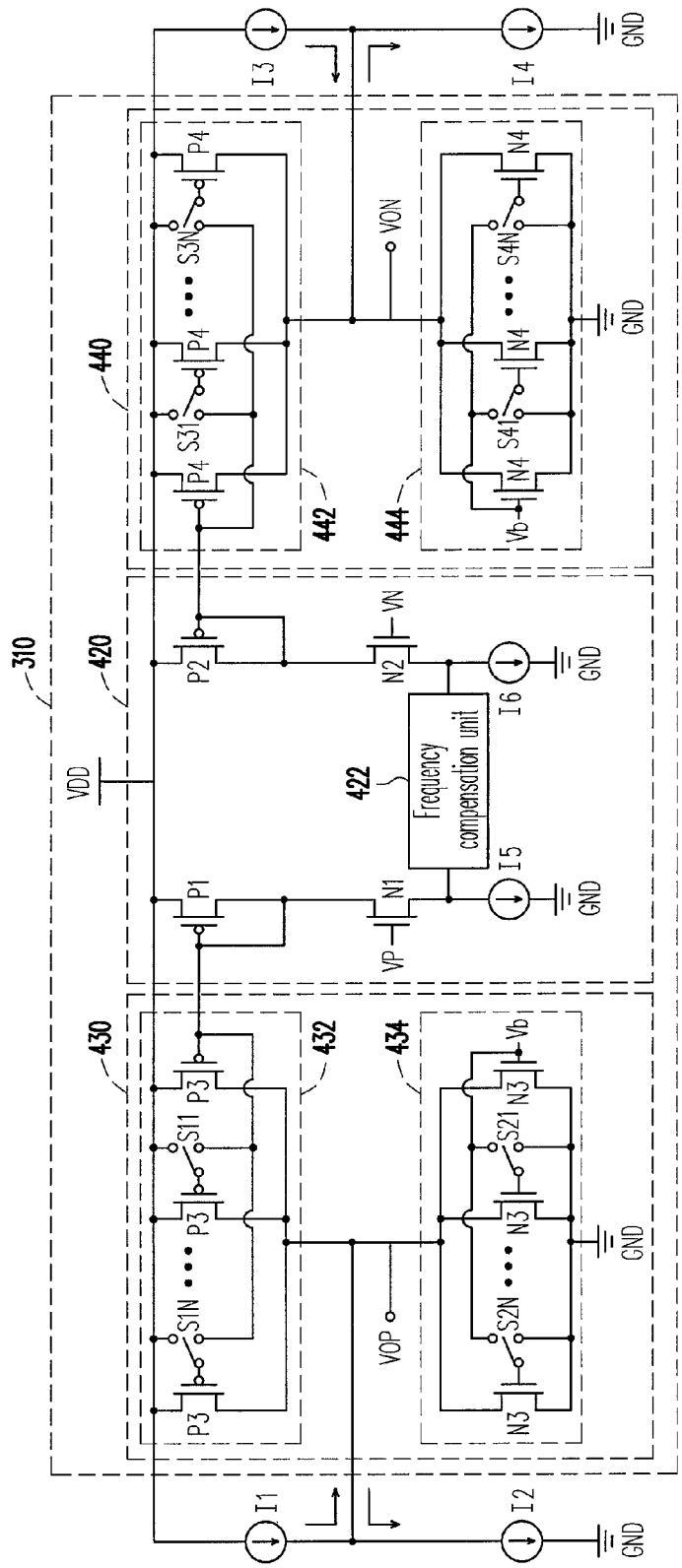
FIG. 4 is a circuit diagram illustrating a differential offset calibration circuit and an adaptive filter according to an exemplary embodiment of the invention.

In the present exemplary embodiment, assuming differential offsets caused by the adaptive filter 310, the sample and hold circuit 320 and the ADC 330 are respectively represented by OFS1, OFS2 and OFS3, to mitigate the differential offsets OFS1, OFS2 and OFS3, a plurality of controllable current sources are added to an output stage of the adaptive filter 310, and the controllable current sources increase or decrease the current amounts that are conducted to the output stage of the adaptive filter 310 according to a digital control code, so as to calibrate the differential offset of the adaptive filter 310. Referring to FIG. 4, FIG. 4 is a circuit diagram illustrating a differential offset calibration circuit and the adaptive filter 310 according to an exemplary embodiment of the invention. The adaptive filter 310 can be regarded as a differential amplifier circuit, which mainly includes an input stage 420 and an output stage (consisting of a first output unit 430 and a second output unit 440). The differential offset calibration circuit includes four controllable current sources I1-I4, wherein the controllable current source I1 is coupled between a voltage source VDD and a first output terminal VOP, the controllable current source I2 is coupled between the first output terminal VOP and a ground terminal GND, the controllable current source I3 is coupled between the voltage source VDD and a second output terminal VON, and the controllable current source I4 is coupled between the second output terminal VON and the ground terminal GND.

The input stage 420 of the adaptive filter 310 includes P-type transistors (for example, PMOS transistors) P1 and P2, N-type transistors (for example, NMOS transistors) N1 and N2, current sources 15 and 16 and a frequency compensation unit 422. Wherein, a source of the P-type transistor P1 is coupled to the voltage source VDD, and a drain thereof is coupled to a gate thereof and a drain of the N-type transistor N1. A source of the N-type transistor N1 is coupled to one end of the current source I5, and another end of the current source I5 is coupled to the ground terminal GND. A source of the P-type transistor P2 is coupled to the voltage source VDD, and a drain thereof is coupled to a gate thereof and a drain of the N-type transistor N2. A source of the N-type transistor N2 is coupled to one end of the current source I6, and another end of the current source I6 is coupled to the ground terminal GND. The frequency compensation unit 422 is coupled between the source of the N-type transistor N1 and the source of the N-type transistor N2 to achieve a high-frequency compensation, which can be formed by capacitors and resistors. Wherein, the gates of the N-type transistor N1 and the N-type transistor N2 are respectively coupled to input terminals VP and VN for receiving a differential input signal.

The output stage of the adaptive filter 310 includes the first output unit 430 and the second output unit 440, wherein the first output unit 430 and the second output unit 440 are symmetric, and respectively have the first output terminal VOP and the second output terminal VON for generating a differential output signal. The first output unit 430 includes a first mapping unit 432 and a first gain control unit 434. The first mapping unit 432 includes a plurality of P-type transistors P3, and the P-type transistors P3 are connected in parallel between the voltage source VDD and the first output terminal VOP, and a gate of each of the P-type transistors P3 is selectively coupled to the voltage source VDD or the gate of the P-type transistor P1 for mapping the current conducted by the P-type transistor P1. The first gain control unit 434 includes a plurality of N-type transistors N3, and the N-type transistors N3 are connected in parallel between the first output terminal VOP and the ground terminal GND, and gates of the N-type transistors N3 are selectively coupled to a bias voltage Vb or the ground terminal GND.

Gates of the P-type transistors P3 can be selectively coupled to the voltage source VDD or the gate of the P-type transistor P1 through switching devices S11-S1N, the switching devices S11-S1N are, for example, one-to-two switching devices or multiplexers, which can be disposed among the P-type transistors P3, the voltage source VDD and the gate of the P-type transistor P1 according to a design requirement. As shown in FIG. 4, regarding the P-type transistors P3 of the first mapping unit 432, besides a first P-type transistor P3, the gates of the other P-type transistors P3 are all coupled to the switching devices S11-S1N for switching. During the operation, when the gate of the P-type transistor P3 is conducted to the voltage source VDD, it represents that the P-type transistor P3 is turned off, and when the gate of the P-type transistor P3 is conducted to the gate of the P-type transistor P1, it represents that the P-type transistor P3 is turned on. Similarly, switching devices S21-S2N are respectively coupled among the gates of the N-type transistors N3, the ground terminal GND and the bias voltage Vb for controlling conductive states of the N-type transistors N3.

The second output unit 440 includes a second mapping unit 442 and a second gain control unit 444. The second mapping unit 442 includes a plurality of P-type transistors P4, and the P-type transistors P4 are connected in parallel between the voltage source VDD and the second output terminal VON, and a gate of each of the P-type transistors P4 is coupled to the gate of the P-type transistor P2 for mapping the current conducted by the P-type transistor P2. The second gain control unit 444 includes a plurality of N-type transistors N4, and the N-type transistors N4 are connected in parallel between the second output terminal VON and the ground terminal GND.

Switching devices S31-S3N are respectively coupled among the gates of the P-type transistors P4, the voltage source VDD and the gate of the P-type transistors P2 for controlling conductive states of the P-type transistors P4. Switching devices S41-S4N are respectively coupled among the gates of the N-type transistors N4, the ground terminal GND and the bias voltage Vb for controlling conductive states of the N-type transistors P4. The switching devices S11-S1N, S21-S2N, S31-S3N and S41-S4N are respectively controlled by a gain signal for determining conductive paths thereof, so as to adjust a number of conducted transistors, and the more the number of the conducted transistors is, the higher a conducting current is, and the higher a gain is. The gain signal is, for example, a gain code of N-bits, and individual bit thereof can be used to control the conductive path of each of the switching devices S11-S1N, S21-S2N, S31-S3N and S41-S4N.

Moreover, it should be noticed that in the present exemplary embodiment, the number of conducted P-type transistors P3 in the first output unit 430 is identical to the number of conducted N-type transistors N3. Similarly, the number of conducted P-type transistors P4 in the second output unit 440 is identical to the number of conducted N-type transistors N4. Namely, direct currents in the first output unit 430 and the second output unit 440 are symmetrically varied along with the gain signal. Moreover, numbers of the switching devices configured in the first output unit 430 and the second output unit 440 are not limited, and one or a plurality of the switching devices can be configured to control conductive states of one or a plurality of transistors according to an actual design requirement. After descriptions of the disclosure of the invention, those skilled in the art can easily deduce the other implementations, and details thereof are not repeated.

The controllable current sources I1-I4 can be selectively enabled or disabled according to a required setting value defined by a designer, so as to increase or decrease the currents conducted by the first gain control unit 434 and the second gain control unit 444. The differential offset can be adjusted by adjusting the current amounts of the first gain control unit 434 and the second gain control unit 444. For example, if the original circuit has a negative differential offset (i.e. a direct current (DC) voltage of the second output terminal VON is greater than that of the first output terminal VOP), the controllable current sources I1 and I4 are enabled, and the controllable current sources I2 and I3 are disabled. The controllable current sources I1 and I4 can generate two currents with the same magnitude, wherein the current generated by the controllable current source I1 can increase the current conducted by the first gain control unit 434, so as to increase the DC voltage of the first output terminal VOP, while the current generated by the controllable current source I4 can decrease the current conducted by the second gain control unit 444, so as to decrease the DC voltage of the second output terminal VON. In this way, the negative differential offset is mitigated.

If the original circuit has a positive differential offset (i.e. the DC voltage of the second output terminal VON is less than that of the first output terminal VOP), the controllable current sources I2 and I3 are enabled, and the controllable current sources I1 and I4 are disabled. The controllable current sources I2 and I3 can generate two currents with the same magnitude, wherein the current generated by the controllable current source I2 can decrease the current conducted by the first gain control unit 434, so as to decrease the DC voltage of the first output terminal VOP, while the current generated by the controllable current source I3 can increase the current conducted by the second gain control unit 444, so as to increase the DC voltage of the second output terminal VON. In this way, the positive differential offset is mitigated. In other words, the controllable current sources I1 and I3 can increase the current amount flowing into the first output terminal VOP or the second output terminal VON, so as to increase the DC voltage of the first output terminal VOP or the second output terminal VON, and the controllable current sources I2 and I4 can extract current from the first output terminal VOP or the second output terminal VON, so as to decrease the DC voltage of the first output terminal VOP or the second output terminal VON. When the differential offset is adjusted, the controllable current sources I1-I4 are divided into two groups, wherein the controllable current sources I2 and I3 are belonged to one group, and the controllable current sources I1 and I4 are belonged to another group. Then, one of the groups is enabled and the other group is disabled according to the differential offset (the positive offset or the negative offset) of the adaptive filter 310, so as to adjust the differential offset of the adaptive filter 310.

According to the above descriptions, as long as enabling/disabling of the controllable current sources I1-I4 and the current amounts thereof are suitably controlled, the DC voltages of the first output terminal VOP and the second output terminal VON can be adjusted to mitigate the differential offset OFS1 of the adaptive filter 310. Moreover, in such circuit structure, the differential offsets OFS2 and OFS3 of the sample and hold circuit 320 and the ADC 330 can be simultaneously considered, and can be calibrated in advance in the adaptive filter 310. Namely, the controllable current sources I1-I4 are adjusted according to the differential offsets OFS1, OFS2 and OFS3 caused by the whole circuit, so as to entirely calibrate the differential offsets in the whole path. It should be noticed that if the calibrations are performed in the sample and hold circuit 320 and the ADC 330, a following risk cannot be avoided, which is that if the signal output by the adaptive filter 310 has been already distorted, since a post-end circuit cannot recover the distorted signal, the signal may have a permanent distortion. Moreover, the adaptive filter 310 is a fully differential structure, which has a common mode feedback (CMFB) circuit to determine a common mode of the first output terminal VOP and the second output terminal VON. The CMFB circuit is operated according to information of (VOP+VON)/2 ((VOP+VON) represents a voltage summation of the first output terminal VOP and the second output terminal VON), and if such information is influenced, an operation error of the CMFB circuit is probably occurred. Since an inflow current and an outflow current of the differential offset calibration circuit are the same, although the signals of the first output terminal VOP and the second output terminal VON can be changed, the voltage summation (VOP+VON) is not changed, so that the operation of the CMFB circuit is not influenced.

Figure 5:
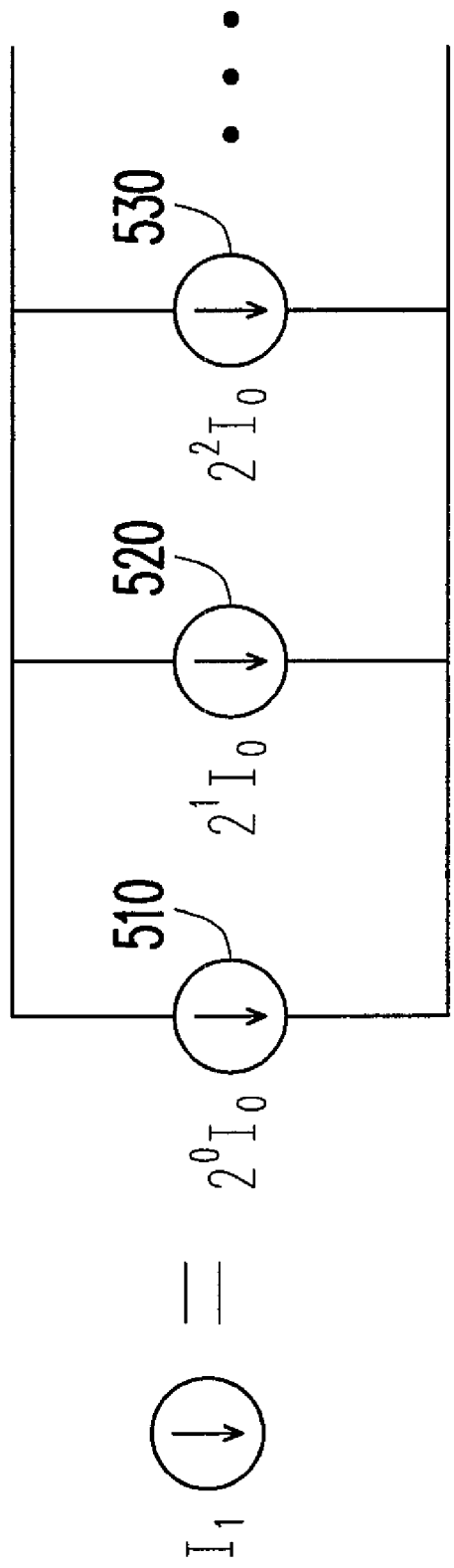
FIG. 5 is a detailed circuit diagram of a controllable current source according to an exemplary embodiment of the invention.

Moreover, each of the controllable current sources I1-I4 can be formed by a plurality of sub current sources connected in parallel, wherein current amounts of the sub current sources can be sequentially increased by a multiple of power of 2, so that a user can adjust the current conducted by each of the controllable current sources I1-I4. Taking the controllable current source I1 as an example, referring to FIG. 5, FIG. 5 is a detailed circuit diagram of a controllable current source according to an exemplary embodiment of the invention. The controllable current source I1 includes a plurality of sub current sources 510-530 connected in parallel, and the current amounts of the sub current sources 510-530 are sequentially a multiple of power of 2 of a standard current $I_0$. Moreover, enabling/disabling of the controllable current sources I1-I4 or the sub current sources 510-530 can be achieved by using switches to block/unblock its current paths, though the invention is not limited thereto. The sub current sources 510-530 can be selectively enabled according to the setting value defined by the user, so as to adjust the current amount of the controllable current source I1 to mitigate the differential offset of the adaptive filter 310. The other controllable current sources I2-I4 have the same structure design as that described above, and after the disclosure of the invention, those skilled in the art can easily deduce the implementations of the controllable current sources I2-I4, and therefore detailed description thereof is not repeated.

Figure 6:
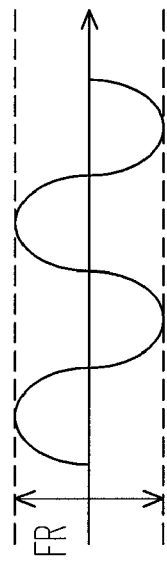
FIG. 6 is a waveform schematic diagram illustrating a downward adjustment of a differential offset.
Figure 6:
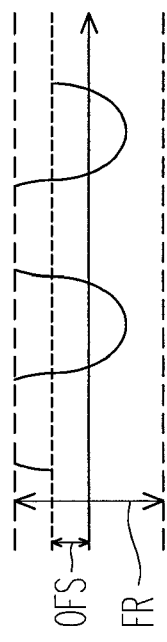
Figure 7:
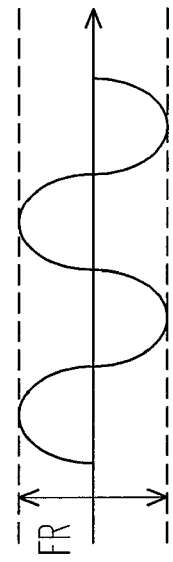
FIG. 7 is a waveform schematic diagram illustrating an upward adjustment of a differential offset.
Figure 7:
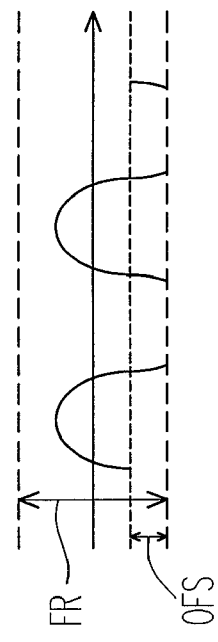

Then, referring to FIG. 6 and FIG. 7, FIG. 6 is a waveform schematic diagram illustrating a downward adjustment of a differential offset, and FIG. 7 is a waveform schematic diagram illustrating an upward adjustment of a differential offset. A left part diagram of FIG. 6 is a signal waveform diagram before the adjustment, and a right part diagram of FIG. 6 is an adjusted signal waveform diagram. A voltage range FR represents an operable voltage range of a signal. Before the adjustment, a signal amplitude of the signal exceeds an upper limit of the voltage range FR due to the differential offset, so that an upper edge part of the signal is removed. By extracting the current from the output terminal, the differential offset can be calibrated downwards to restore an integral signal waveform, as that shown in the right part diagram of FIG. 6. Similarly, a left part diagram of FIG. 7 is a signal waveform diagram before the adjustment, and a right part diagram of FIG. 7 is an adjusted signal waveform diagram. By increasing the current flowing to the output terminal, the differential offset can be calibrated upwards, as that shown in the right part diagram of FIG. 7, and the integral signal waveform of the signal can be restored after the differential offset is calibrated.

According to FIGS. 4-7, it is known that several controllable current sources I1-I4 are added to the output terminals VOP and VON of the adaptive filter 310 for adjusting the differential offset. The current magnitudes provided by the controllable current sources I1-I4 have a relationship of a power of 2, so that the current can be monotonically increased as the digital control code is increased. Since the adaptive filter 310 is integrated with a variable gain structure, and the controllable current sources I1-I4 are coupled to a second stage (the output stage) of the adaptive filter 310 rather than a first stage (the input stage), a problem that the differential offset is changed due to different gains is resolved. The controllable current sources I1-I4 are divided into an inflow group (for example, the controllable current sources I1 and I3) and an outflow group (for example, the controllable current sources I2 and I4), and when the differential offset is adjusted, one inflow current source and one outflow current source are simultaneously enabled, so that an output common mode of the adaptive filter 310 is less influenced when the differential offset is adjusted, and aggravation of an operation accuracy of the common mode feedback circuit is avoided.

In the present exemplary embodiment, besides a wide-range calibration of the differential offsets can be achieved, a high-accuracy calibration function can also be achieved by designing a minimum value provided by the current source. Besides the differential offset in the adaptive filter can be calibrated by the calibration circuit, the calibration circuit can also compensate differential offsets caused by several post-end circuits in advance, so that a signal having a differential offset close to zero can be obtained at the output terminal of the whole receiver. Moreover, since the differential offset calibration circuit can calibrate the differential offset of the circuit by only setting the controllable current sources I1-I4 once, the differential offset can be calibrated without influencing an operation of the receiver.

In summary, a plurality of controllable current sources are added to the output terminals of the adaptive filter, and the differential offset of the adaptive filter can be calibrated by adjusting current amounts and current directions of the controllable current sources, and meanwhile the differential offsets of the post-end circuits can be simultaneously calibrated. The invention is not only suitable for the adaptive filter of the variable gain structure, but can also achieve the wide-range calibration by controlling the magnitudes of the current sources.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A differential offset calibration circuit, adapted to an adaptive filter, the adaptive filter having an input stage and an output stage, the output stage being coupled to the input stage and having a first output terminal and a second output terminal, and the differential offset calibration circuit comprising:
   a first controllable current source, coupled between a voltage source and the first output terminal;
   a second controllable current source, coupled between the first output terminal and a ground terminal;
   a third controllable current source, coupled between the voltage source and the second output terminal; and
   a fourth controllable current source, coupled between the second output terminal and the ground terminal,
   wherein when the first controllable current source and the fourth controllable current source are enabled, the second controllable current source and the third controllable current source are disabled, and when the second controllable current source and the third controllable current source are enabled, the first controllable current source and the fourth controllable current source are disabled.

2. The differential offset calibration circuit as claimed in claim 1, wherein the input stage comprises:
   a first P-type transistor, having a source coupled to the voltage source, and a drain coupled to a gate of the first P-type transistor and a drain of a first N-type transistor, wherein a source of the first N-type transistor is coupled to one end of a fifth current source, and another end of the fifth current source is coupled to the ground terminal;
   a second P-type transistor, having a source coupled to the voltage source, and a drain coupled to a gate of the second P-type transistor and a drain of a second N-type transistor, wherein a source of the second N-type transistor is coupled to one end of a sixth current source, and another end of the sixth current source is coupled to the ground terminal; and
   a frequency compensation unit, coupled between the source of the first N-type transistor and the source of the second N-type transistor,
   wherein the gates of the first N-type transistor and the second N-type transistor are used for receiving an input signal.

3. The differential offset calibration circuit as claimed in claim 2, wherein the output stage comprises:
   a first output unit, having the first output terminal, and the first output unit comprising:
      a first mapping unit, comprising a plurality of third P-type transistors, the third P-type transistors being connected in parallel between the voltage source and the first output terminal, and a gate of each of the third P-type transistors being selectively coupled to the gate of the first P-type transistor or the voltage source; and
      a first gain control unit, comprising a plurality of third N-type transistors, the third N-type transistors being connected in parallel between the first output terminal and the ground terminal, and a gate of each of the third N-type transistors being selectively coupled to a bias voltage or the ground terminal; and
   a second output unit, having the second output terminal, and the second output unit comprising:
      a second mapping unit, comprising a plurality of fourth P-type transistors, the fourth P-type transistors being connected in parallel between the voltage source and the second output terminal, and a gate of each of the fourth P-type transistors being selectively coupled to the gate of the second P-type transistor or the voltage source; and
      a second gain control unit, comprising a plurality of fourth N-type transistors, the fourth N-type transistors being connected in parallel between the second output terminal and the ground terminal, and a gate of each of the fourth N-type transistors being selectively coupled to the bias voltage or the ground terminal.

4. The differential offset calibration circuit as claimed in claim 3, wherein the output stage further comprises:
   a first switching device, coupled among a gate of one of the third P-type transistors, the gate of the first P-type transistor and the voltage source, for selectively conducting the gate of the corresponding one of the third P-type transistors to the gate of the first P-type transistor or the voltage source according to a gain signal;
   a second switching device, coupled among a gate of one of the third N-type transistors, the bias voltage and the ground terminal, for selectively conducting the gate of the corresponding one of the third N-type transistors to the bias voltage or the ground terminal according to the gain signal;
   a third switching device, coupled among a gate of one of the fourth P-type transistors, the gate of the second P-type transistor and the voltage source, for selectively conducting the gate of the corresponding one of the fourth P-type transistors to the gate of the second P-type transistor or the voltage source according to the gain signal; and
   a fourth switching device, coupled among a gate of one of the fourth N-type transistors, the bias voltage and the ground terminal, for selectively conducting the gate of the corresponding one of the fourth N-type transistors to the bias voltage or the ground terminal according to the gain signal.

5. The differential offset calibration circuit as claimed in claim 1, wherein the first controllable current source to the fourth controllable current source respectively comprise a plurality of sub current sources connected in parallel, and conducted current amounts of the sub current sources of each of the controllable current sources are sequentially increased by a multiple of power of 2.

6. The differential offset calibration circuit as claimed in claim 1, wherein each of the controllable current sources adjusts the conducted current amount according to a setting value.

* * * * *